United States Patent [19]

Cowles et al.

[11] Patent Number: 5,263,003
[45] Date of Patent: Nov. 16, 1993

[54] FLASH MEMORY CIRCUIT AND METHOD OF OPERATION

[75] Inventors: Kenneth R. Cowles, Chagrin Falls; Mark J. Duewiger, Mentor; Alex D. Green, Cleveland Heights, all of Ohio

[73] Assignee: Allen-Bradley Company, Inc., Milwaukee, Wis.

[21] Appl. No.: 790,833

[22] Filed: Nov. 12, 1991

[51] Int. Cl.$^5$ ............................................. G11C 8/00
[52] U.S. Cl. ........................ 365/230.03; 365/218; 365/900
[58] Field of Search .................. 365/230.03, 218, 900

[56] References Cited

U.S. PATENT DOCUMENTS

| | | | |
|---|---|---|---|
| 4,413,319 | 11/1983 | Schultz et al. | 364/200 |
| 4,566,082 | 1/1986 | Anderson | 365/230.03 |
| 4,691,303 | 9/1987 | Churchward et al. | 365/230.03 X |
| 4,881,206 | 11/1989 | Kadono | 365/193 X |
| 4,899,310 | 2/1990 | Baba et al. | 365/230.03 X |
| 5,012,408 | 4/1991 | Conroy | 365/230.03 X |
| 5,036,493 | 7/1991 | Nielsen | 365/230.03 |
| 5,060,145 | 10/1991 | Scheuneman et al. | 365/230.03 X |

OTHER PUBLICATIONS

Book entitled *CMOS Memory Products,* published in 1991 by Advanced Microdevices, Inc.

Primary Examiner—Eugene R. LaRoche
Assistant Examiner—Do Hyun Yoo
Attorney, Agent, or Firm—Quarles & Brady

[57] ABSTRACT

A memory circuit for storing words of data has two memory banks each formed by a plurality of memory devices connected in parallel. In a first mode, the memory circuit responds to an initial request for access and an address signal by reading data from a storage location in one of the memory banks. Subsequent requests for access to contiguous storage locations do not require an address signal, instead a control mechanism responds by generating an address to read data alternately from storage locations in the first and second memory banks. In a second mode, the memory circuit responds to every request for access to the memory circuit by enabling access to the first or second memory bank as indicated by an address which accompanied the request. The memory devices of a given bank are erased and programmed in parallel. However, when a given storage location is found to contain one or more bits that were not erased, another erase command is sent to only those memory devices associated with a bit that was not erased. Similarly, when a word of data has not been stored properly, only those memory devices which failed to store a bit are placed into the write state for another programming attempt.

19 Claims, 5 Drawing Sheets

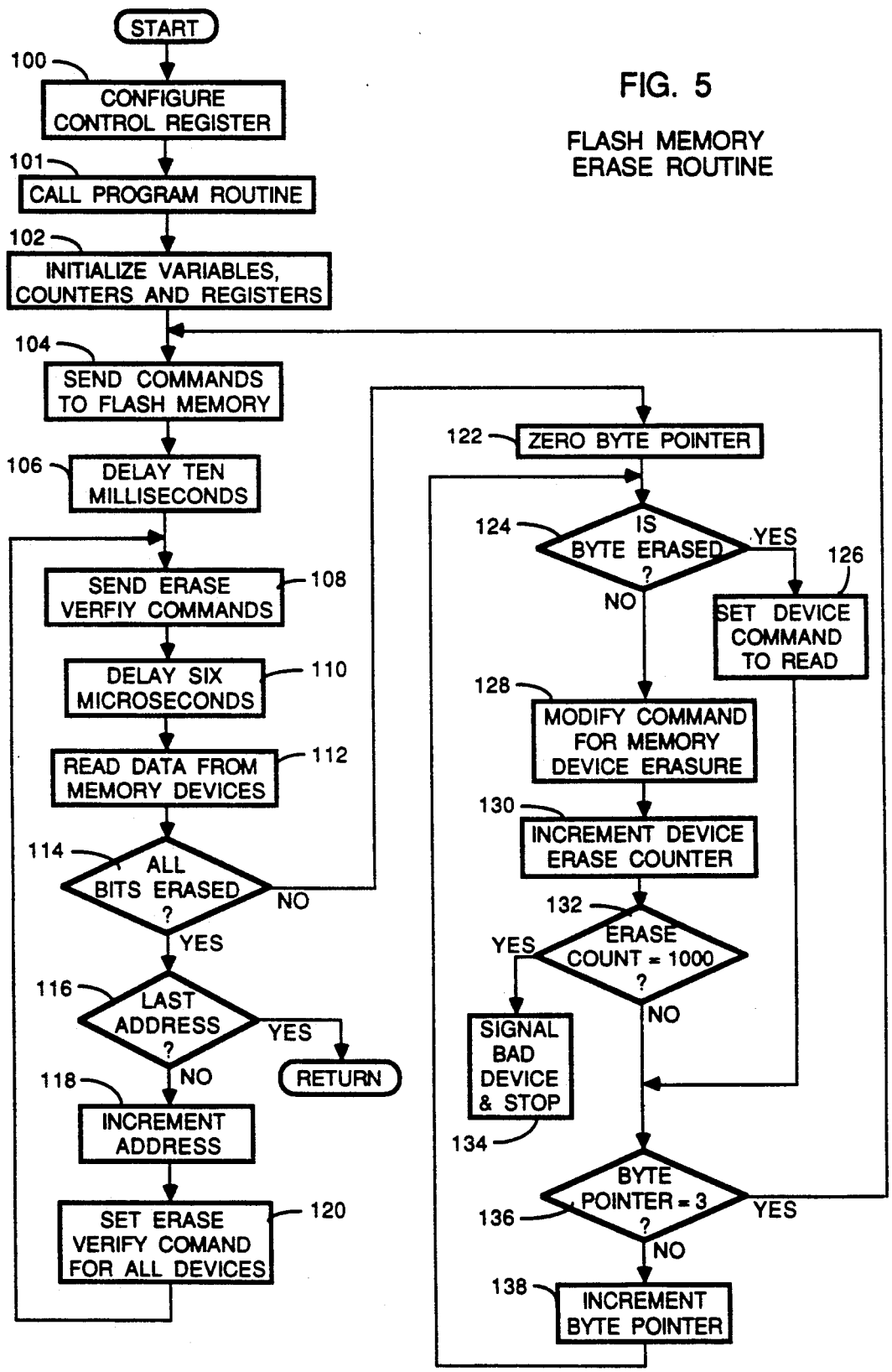

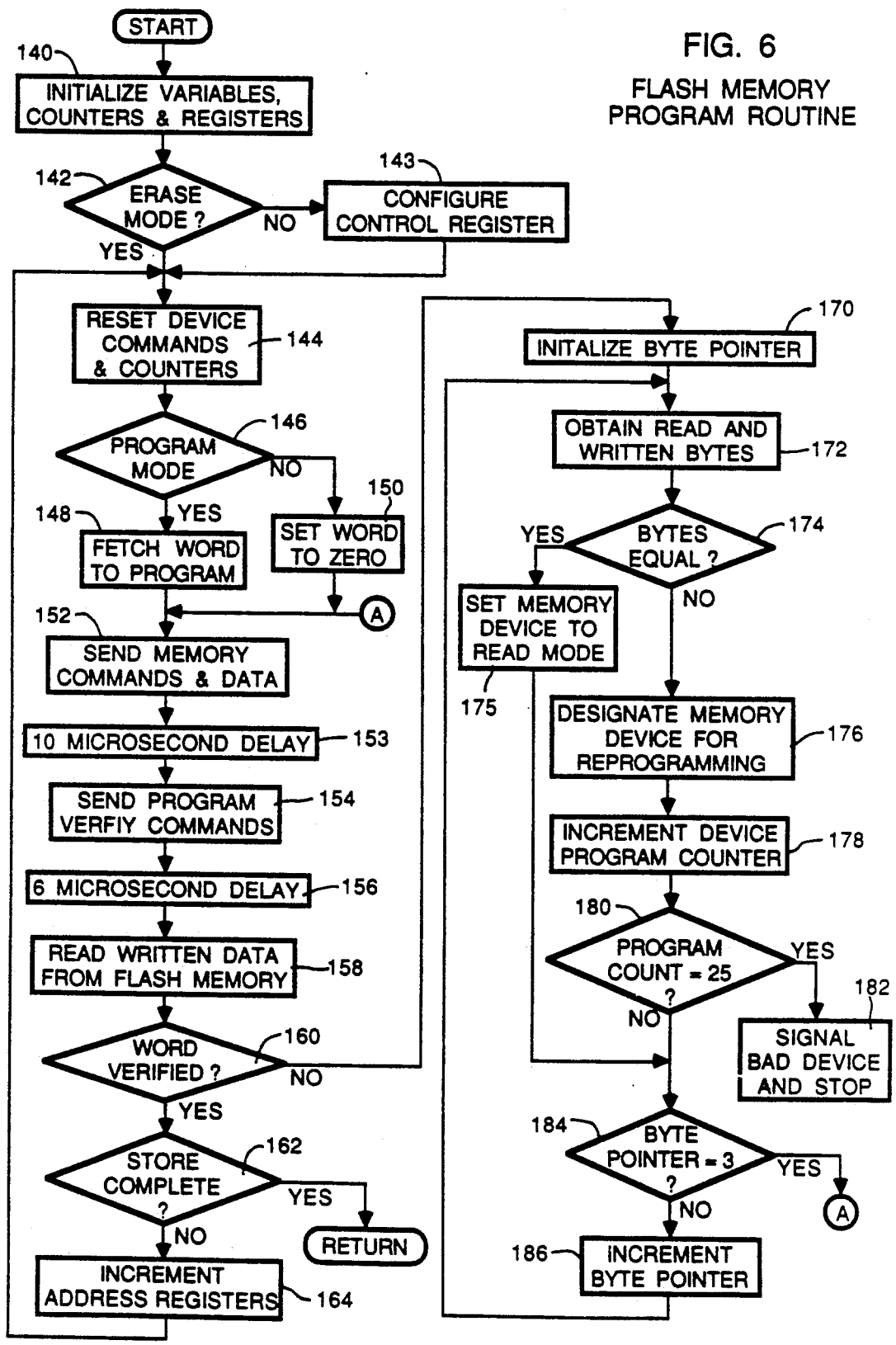

FLASH MEMORY CIRCUIT AND METHOD OF OPERATION

BACKGROUND OF THE INVENTION

The invention relates to solid state memory devices for storing digital data; and particularly to a class of such devices commonly referred to as flash memories.

A flash memory is a non-volatile storage device which is based on erasable programmable read only memory (EPROM) and electrically erasable programmable read only memory (EEPROM) technologies. As such, these devices can be programmed in the equipment in which they are used by applying a programming-erasing voltage and executing an erasure procedure to set all of the bits in the device to a high logic level. Thereafter, another procedure is used to program the device with new data. It is predicted that flash-type devices will be used in many applications that today are implemented by EPROM, EEPROM, battery-backed static RAM and disk memory.

Standard memories are commonly configured as interleaved banks of devices to obtain improved performance and faster access time. In this technique, two or more banks of identical memory devices are arranged in such a way that the requests for data from each one overlap, i.e. when one bank is delivering data, the other bank is preparing to deliver the next sequential item of data. In this way, slower, cheaper memory devices may be employed which none the less deliver high performance.

One drawback to flash-type memories is that presently available devices must be erased entirely before they can be reprogrammed. If such devices are to be reprogrammed in the equipment, as opposed to being removed for reprogramming, the reprogramming software routines must be stored elsewhere in the equipment. Typically, this is accomplished by providing additional memory devices, such as a non-volatile memory or a separate read only memory for the reprogramming routines.

Another class of flash memory devices has been proposed, but as yet is not commercially available, which are commonly referred to as sectored erase flash memories. These flash memories have a group of storage locations which can never be erased in the circuit, in which an initialization routine or the reprogramming routines reside. While this protected sector overcomes the problem associated with present flash memories, presumably new devices will have to be installed if the protected routines have to be changed. Another problem is that the memory is divided into fixed size sectors that may not optimally meet the size requirements of a particular user.

Therefore, it is desirable to provide flash memories which can store initialization and reprogramming routines in a manner which allows not only the remaining sections of the device to be reprogrammed, but when necessary, allows the initialization and reprogramming routines to be changed.

Furthermore, currently available flash memory devices are eight bits wide, requiring that several of them be connected in parallel in order to store sixteen or thirty-two bit wide data words, required by many microprocessors. Such a parallel connection is well known and has been used with a variety of other types of eight-bit wide memory devices. With the previous parallel configurations, it was quite common to erase and reprogram all of the devices in a memory bank in parallel. That is, a given address is applied to all of the parallel connected devices and the corresponding storage location in each one is erased simultaneously. The storage locations are then tested to verify that they have properly erased. Should a storage location in one of the parallel connected memory devices fail to erase, the process is repeated by erasing all of the parallel connected devices once again.

Although this technique is acceptable with other types of memories, one of the drawbacks of flash type memories is a limitation in the number of erasure cycles to which a given storage location may be subjected. Therefore, subjecting all of the devices in a given bank to additional erasure cycles, when only one device has failed to properly erase, subjects the other devices to needless erasure cycles which may cause permanent damage. As a consequence, a common technique used with flash-type memories is to erase each device of the bank independently so as to subject the devices only to the number of erasure cycles actually required for that device. Although this individual erasure process overcomes the problem of subjecting a given device to needless erasure cycles, significantly greater amount of time is required. Therefore, the designer of a circuit which incorporates a flash memory is faced with the trade-off between parallel erasure process which may over erase the devices and an individual erasure process which is time consuming.

SUMMARY OF THE INVENTION

A memory circuit is provided to store words of digital data at different storage locations within the memory. A first means receives a storage location address and a second means receives control signals that represent a request for access to the memory circuit. The memory has first and second memory banks each having a series of storage locations and being coupled to the means for exchanging data. In the preferred embodiment, each memory bank is formed by a plurality of integrated circuit memory devices connected in parallel with each device storing a different group of bits of a word of digital data. An address bus is connected to the first and second memory banks to carry an address signal that indicates a storage location to be accessed.

A control mechanism places the memory circuit into one of two modes of operation. In the first mode, the control mechanism responds to an initial request for access and an address signal by reading data from a storage location in one of the memory banks. Subsequent requests for access to the next adjacent storage location do not require that an address be sent with the request. The control mechanism responds to such subsequent requests by generating addresses to read data alternately from storage locations in the first and second memory banks. However a request for access to other than the next adjacent storage location requires that an address accompany the request.

In the second mode of operation, the control mechanism responds to every request for access to the memory circuit as in the first mode, but by enabling one and only one of the two memory banks as determined by control signals accompanying the request. This provides a unique means by which the other memory bank may be completely erased and reprogrammed, without requiring additional external memory.

A novel method for erasing and programming the memory circuit also is disclosed. The memory is erased by issuing an erase command which clears all the storage locations in every memory device in the bank. Then the contents of each storage location are read sequentially to determine whether every bit has been erased from each location. When a given storage location is found to contain a bit that was not erased, another erase command is sent to only those memory devices associated with a bit that was not erased. Thereafter, the contents of the given storage location are read again to determine whether all the bits now have been erased.

Once a complete erasure of the memory circuit has been verified, reprogramming can commence. All the memory devices are placed simultaneously into a write state and an address of a given storage location and a word of data are sent to the memory devices. Then the contents of the given storage location are read. The contents read from the given storage location are compared to the word of data sent to determine whether the word of data has been stored properly. When the comparing step indicates that the word of data has not been stored properly, only those memory devices which did not properly store bits of the data word are placed into the write state and the word of data is sent again to the memory circuit. Typically the given storage location is checked again to determine if the data now has been properly stored therein. If so, the procedure is repeated to store data in another storage location.

The erasing and reprogramming method verifies that each storage location has been properly erased and reprogrammed. When a specific one of the memory devices in a memory bank fails to be erased or reprogrammed, only that device is erased or programmed again. This technique spares properly functioning memory devices from being subjected to unnecessary erase and programming operations and increases system performance by reprogramming, erasing and verifying the memory devices in parallel.

BRIEF DESCRIPTION OF THE DRAWINGS

FIG. 5 is a flowchart of a software routine for erasing the flash memory; and

FIG. 6 is a flowchart of a software routine for programming the flash memory.

DETAILED DESCRIPTION OF THE INVENTION

Figure 1:
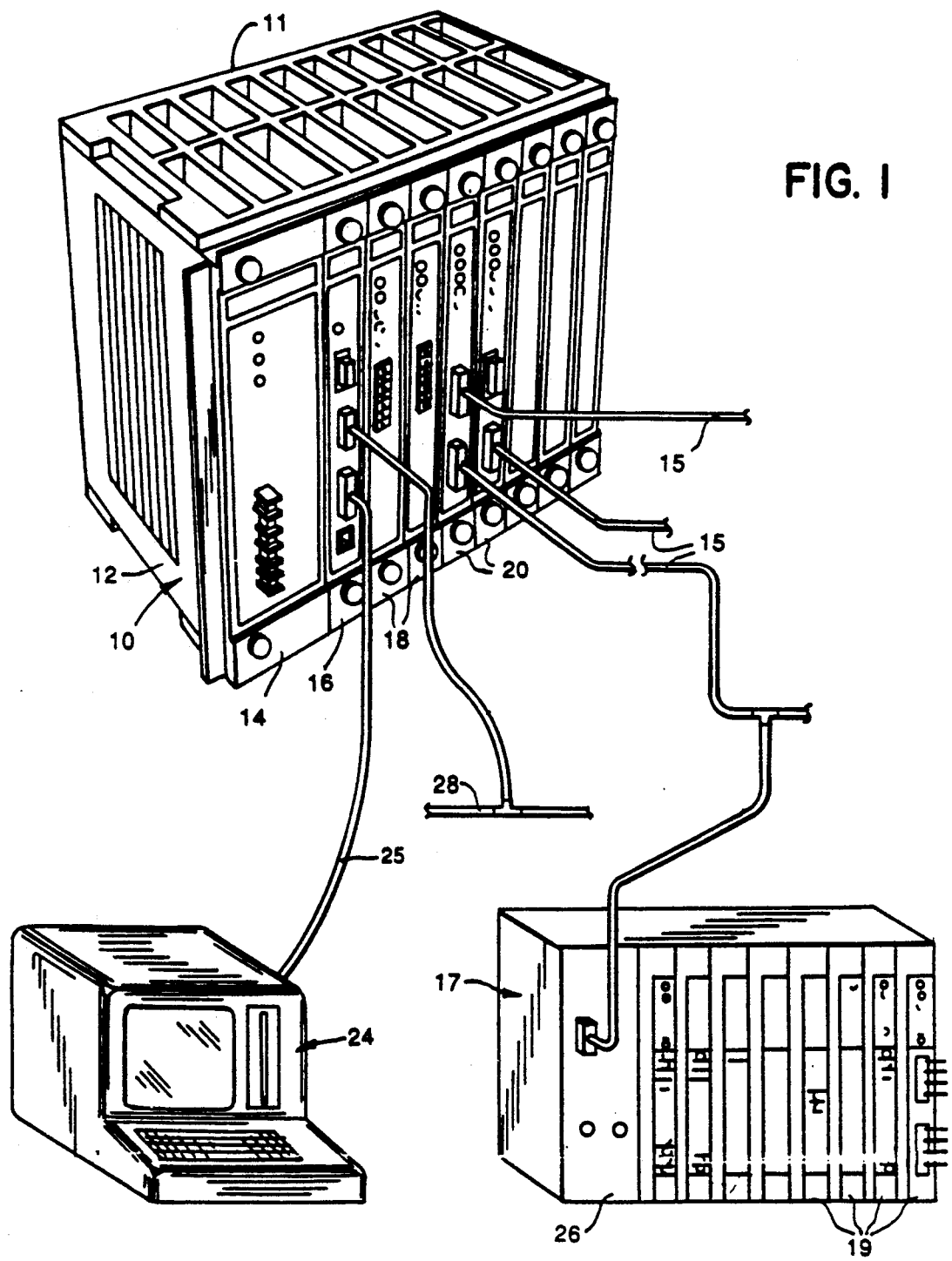
FIG. 1 is a pictorial representation of a programmable controller.

With initial reference to FIG. 1, a programmable controller 10 of the present invention is housed in a rack 12 which includes a series of slots that receive a plurality of printed circuit board modules. These functional modules connect to a mother board which extends along the back surface of the rack 12 to provide a backplane 11. The backplane 11 has a plurality of module connectors which are interconnected by a conductive pattern on the backplane. The backplane 11 provides a series of signal buses to which the modules connect. The rack 12 contains a power supply module 14, a system controller 16, a number of program execution processor modules 18 and a plurality of remote input/output (I/O) scanner modules 20, although only one scanner module is required. The remaining locations in rack 12 are empty and the slots are covered by blank plates until additional functional modules are to be inserted in these slots.

Up to four remote I/O scanner modules 20 interface the controller 10 to external remote I/O racks 17 via serial I/O data links 15. Each remote I/O rack 17 has a plurality of local I/O modules 19 which are coupled to individual sensors and actuators on the controlled equipment. The local I/O modules 19 may take many forms and may provide D.C. inputs or outputs, A.C. inputs or outputs, analog inputs or outputs, and open or closed loop positioning modules, for example. The I/O racks 17 and networks 15 employ conventional interface and communication technology. The remote I/O rack 17 also contains an adapter module 26; such as the one described in U.S. Pat. No. 4,413,319, which controls the transmission of data via the I/O network 15 between the I/O modules 19 and the scanner modules 20.

The system controller 16 is connected through cable 25 to a programming terminal 24, which is used to load the user programs into the programmable controller and configure its operation, as well as monitor system performance. The terminal 24 is a personal computer programmed to enable the user to develop the control programs on the terminal, which then are loaded into the programmable controller. Once the programs have been loaded into the programmable controller 10 and their operation debugged, the terminal 24 may be disconnected from the system controller 16 if operational monitoring is not required. The system controller 16 also may be connected to a local area network (LAN) 28, over which data and programming instructions can be received and status information and report data sent to a host computer. This enables a host computer or central terminal to program and control the operation of a plurality of programmable controllers on a factory floor.

SYSTEM CONTROLLER

Figure 2:
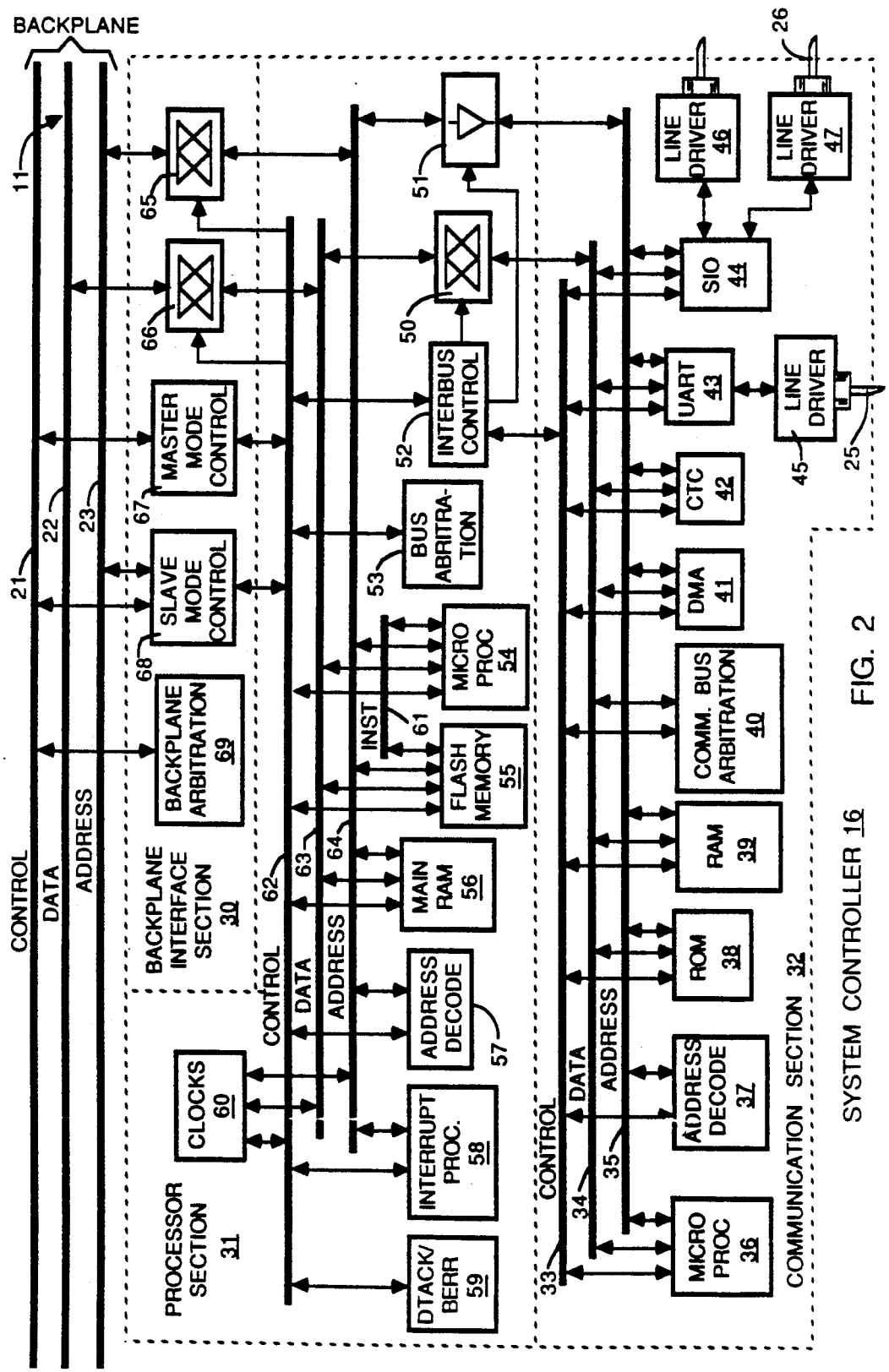
FIG. 2 is a schematic diagram of a system controller in FIG. 1 which uses a flash memory according to the present invention.

The system controller circuitry, as shown schematically in FIG. 2, connects to backplane buses 21-23 and is divided into three sections 30, 31 and 32 (delineated by dashed lines) for backplane interface, processing and communication functions. The backplane interface section 30 supervises access to the rack backplane 11 by all the rack modules and connects the system controller module 16 to the backplane. The processor section 31 executes a supervisory program for the controller 10 and the communication section 32 is primarily responsible for communicating with external terminal 24 and local area networks, such as LAN 28. Both the processor and communication sections 31 and 32 have a set of internal buses 62-64 and 33-35, respectively.

The communication section buses consist of control bus 33 having a number of individual control lines running between the components in the communication section, a parallel data bus 34 and a parallel address bus 35. The communication section 32 is built around a first microprocessor 36, which executes machine language instructions stored in a read-only memory (ROM) 38. The instructions are fetched from the ROM, decoded and then executed by the microprocessor 36 to carry out the communication functions. The program controlling these functions is similar to that employed in previous programmable controllers.

A conventional address decoding circuit 37 receives each address issued by the first microprocessor 36 and decodes it to produce the proper set of signals on control bus 33. For example, when the first microprocessor 36 is accessing the ROM 38, the address decode circuit 37 will recognize that the address sent by the microprocessor on bus 35 is within the range of addresses at which the ROM is located. Once it has recognized which device in the communications section is to be accessed, the address decode circuit 37 produces control signals for the device to carry out the access.

Two serial input/output devices, UART 43 and serial input/output controller (SIO) 44, also are connected to the three communication sections buses 33–35. The UART 43 may be any of several commercially available universal asynchronous receiver/transmitter integrated circuits. The UART 43 converts the parallel data which is present on the communication data bus 34 into a properly formatted serial signal which is fed to an input/output line driver 45. The line driver 45 provides output signals corresponding to any one of several serial signal standards, such as RS232, RS423 or RS422. The serial I/O (SIO) communication controller 44 may be any of several standard integrated circuits which service two synchronous serial communication channels. The SIO 44 interfaces the communication section of the system controller 16 to local area networks connected to the line drivers 46 and 47, such as network 28 of FIG. 1. The programming terminal 24, shown in FIG. 1, is connected to one of these line drivers 46 or 47.

Also located within the communication section 32 is a random access memory (RAM) 39 for temporary storage of data received from or to be sent to the various external devices connected to the system controller 16. The RAM 39 may be accessed via address bus 35 so that data may be written into or read from the memory via bus 34 depending upon enabling signals from control bus 33. A direct memory access (DMA) circuit 41 is provided to enable rapid data exchange between the SIO 44 and the RAM 39 during the communication process. The DMA circuit 41 allows the SIO 44 to access RAM 39 to store or obtain data which have been received or will be transmitted over their respective external communication channels.

Access to the communication buses 33–35 is controlled by an arbitration circuit 40 which resolves conflicts when several devices request access to these buses at the same time. The arbitration circuit 40 determines which component of the communication section will have access to the shared buses 33–35. A device seeking the buses sends a request signal to the arbitration circuit 40 via a line of the control bus 33 and the arbitration circuit grants the request to one device at a time by producing an access signal on another control line for that device.

A counter/timer circuit (CTC) 42 connects to the communication buses 33–35 and to an interrupt terminal on the first microprocessor 36 in order to process interrupt requests from the other components within the communications section. The CTC 42 is also configured as a timer to produce an interrupt request to the first microprocessor 36 at a given interval, such as every ten milliseconds, so that various routines may be periodically executed regardless of the task then being performed. In response to such an interrupt request, the first microprocessor 36 reads a vector from the CTC 42 directing the microprocessor to the appropriate interrupt service routine stored in ROM 38, such as one to handle a data request from either UART 43 or SIO 44.

Referring still to FIG. 2, the processor section 31 is linked together by a set of buses that comprise control lines 62, a thirty-two bit wide data bus 63 and a parallel address bus 64. Access to these buses 62–64 is controlled by an arbitration circuit 53 similar to circuit 40 on the communication buses. Two sets of signal gates 50 and 51 extend between the communication section buses 34 and 35 and processor section buses 63 and 64 of the system controller module 16. Specifically, the first set of gates 50 provides a bidirectional connection of the communication section data bus 34 to the data bus 63 of the processor section 31; and the second set of gates 51 connects the two address buses 35 and 64. An interbus control circuit 52 is connected to control lines 62 and 33 in the processor and the communication sections 31 and 32, respectively, and responds to access request signals from arbitration circuits 40 and 53 by enabling the data and address gates 50 and 51.

The processor section 31 is built around a thirty-two bit second microprocessor 54, such as a model 29000 manufactured by Advanced Micro Devices, which executes program instructions stored in a programmable read only memory (PROM) 55. The instructions are read from the PROM 55 via a separate instruction bus 61, whereas the data bus 63 carries to the PROM for storage the instructions, as will be described. The PROM 55 is a flash type memory in which each storage location is thirty-two bits wide. The present invention relates to the details of the configuration and operation of the flash memory which will be described hereinafter.

The second microprocessor 54 is essentially a memory mapped device and does not have any input/output lines directly connected to it. Therefore, its access to other components on the processor bus must be accomplished through issuing addresses on bus 64. The address sent from the second microprocessor 54 is decoded in an address decode circuit 57 to produce the proper control signals for the accessed component. The processor address decoder 57 functions in much the same manner as the communication section address decoder circuit 37. The processor section 31 also contains an interrupt processor which controls interrupts to the second microprocessor 54.

A data transfer acknowledge and bus error (DTACK/BERR) circuit 59 is also connected to the processor control bus 62. Circuit 59 responds to signals from the various components in the processor section 31 to acknowledge the completion of a data transfer and issue bus error signals in the event of improper addressing or failure of data transfer. These signals are acted on by the second microprocessor 54 to take corrective action. The processor section 31 also includes clock circuit 60 that contains the main system clock and a real time clock.

The main random access memory (RAM) 56 for the system controller 16 is also connected to the processor buses 62–64. The RAM 56 is a memory containing memory locations which are thirty-two bits wide, and serves as the system memory for the entire controller 10. The system RAM 56 can be directly accessed via the backplane 11 by other modules in the system without the intervention of the second microprocessor 54 within the system controller. The main RAM 56 stores configuration data provided by the user via terminal 24, as well as other data that is shared by several functional modules.

Continuing to refer to FIG. 2, the processor section 31 of the system controller 16 interfaces with the buses 21-23 of the rack backplane 11 via a plurality of components that are coupled to both sets of buses. Specifically, the backplane data bus 22 is connected to the processor section data bus 63 by a set of bidirectional data transmission gates 66 and the backplane address bus 23 is connected to the processor section address bus 64 by another set of bidirectional gates 65. When the system controller 16 seeks to exercise control over the backplane 11, a master mode control circuit 67 responds to signals on the control lines of the processor section bus 62 and issues the proper control signals over the backplane control bus to access other modules within the rack 12.

When another module within the rack 12 seeks to access to the system controller 16 in order to read the contents of main RAM 56, for example, the system controller becomes subordinate to the control of the backplane 11 by this other module. In this circumstance, a slave mode control circuit 68 within the system controller 16 responds to signals carried on the backplane address bus 23 and on the control lines of the backplane bus 21 which lead from the other module. In response the slave mode control 68 issues signals to transmission gates 65 and 66 enabling the other backplane module to access the system controller 16. In this latter instance, the master mode control circuit 67 is in a dormant state. The two bus gates 65 and 66 receive enabling control signals from the master or slave mode control circuits 67 and 68 via the lines of control bus 62 depending upon the mode of backplane communication. A backplane arbitration circuit 69 supervises access to the backplane 11 and resolves conflicting requests for access from the modules in the system.

FLASH MEMORY HARDWARE

The programmable read only memory in the processor section 31 is a flash-type memory 55 such as described in *Flash Memory Products Data Book*, published in 1989 by Advanced Micro Devices. These particular devices are configured to operate in the burst addressing mode performed by the second microprocessor 54. In this addressing mode, the second microprocessor 54 sends an initial address of a section of memory which it wishes to access. For example, the address may be the storage location for the first of a series of program instructions which are to be consecutively read from the memory and applied to the microprocessor. The flash memory 55 receives the initial address and upon the receipt of control signals for each subsequent read/-write cycle, the memory address generator increments steps to the next consecutive storage location. When the second microprocessor 54 seeks access to a non-consecutive address, such as occurs when a jump instruction is encountered in the control program and the next instruction is not adjacent to the previous one, the second microprocessor transmits a new address to the flash memory 55.

The flash memory 55 also accommodates a sequential addressing mode of the second microprocessor 54 in which each request for access to a storage location is accompanied by its address. Control signals received from the microprocessor 54 designate the addressing mode being utilized at any given time.

Figure 3:
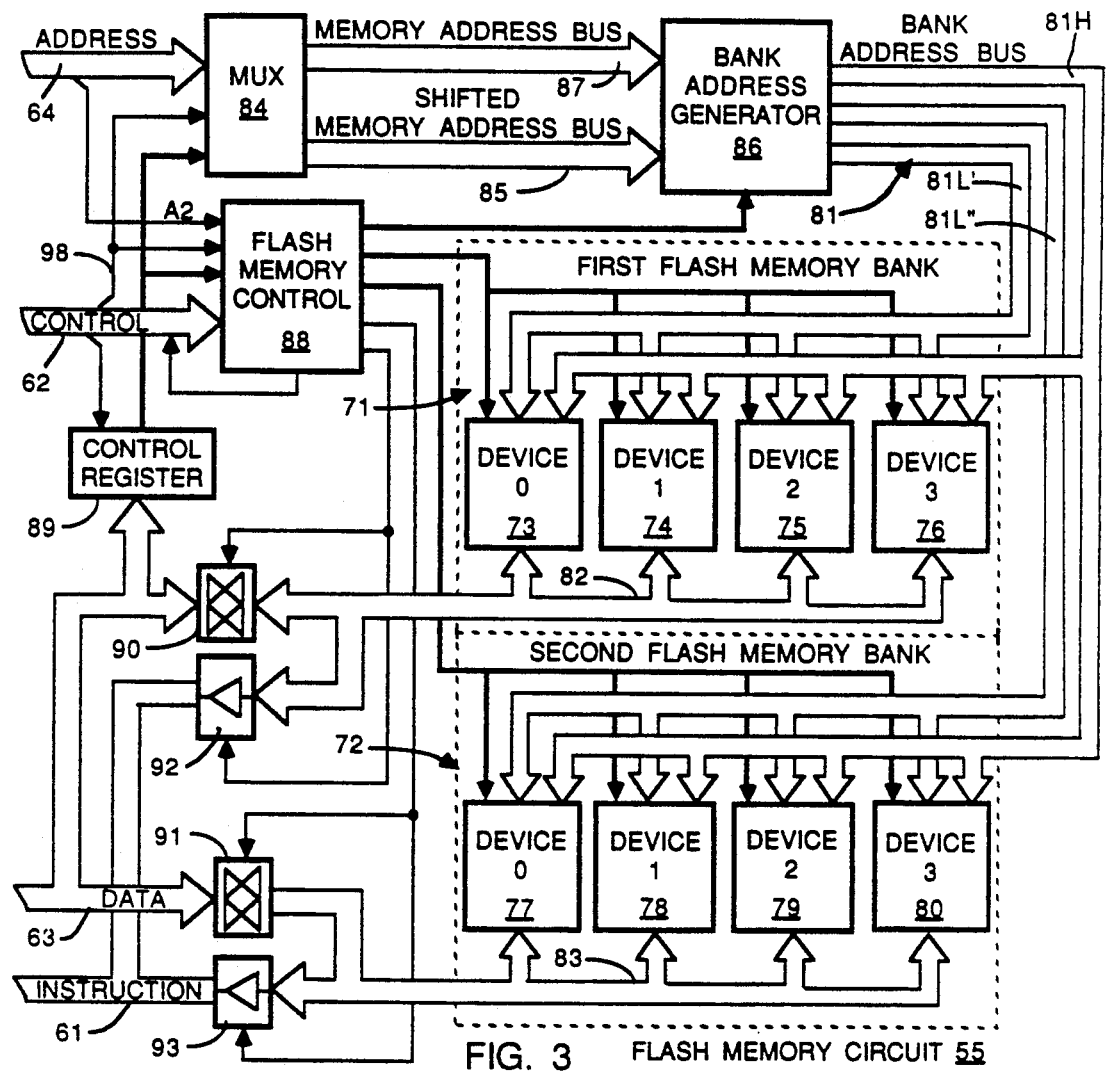
FIG. 3 is a schematic diagram of the flash memory.

With reference to FIG. 3, the flash memory 55 has two banks 71 and 72, denoted by dashed lines, with each bank having four flash memory devices 73-76 and 77-80, respectively. For example, the flash memory devices are model 28F010 devices manufactured by Advanced Micro Devices. Each memory device is eight bits wide and four of them are connected in parallel to a common bank address bus 81 and internal bank internal data buses 82 or 83. Different bit lines of the data buses 82 and 83 connect to each memory device 73-76 and 77-80. Thus the combination of the four memory devices in a given bank enable a thirty-two bit wide word of data to be contained in each individually addressable storage location in the bank. The second microprocessor 54 issues addresses for bytes of data rather than the thirty-two bit words as the data is stored in the flash memory 55. Thus the address on the processor section bus 64 must be divided by four in order to produce the address of the word in memory that contains the desired byte. The resultant address is referred to herein as the "word address" and is applied to the bank address bus 81. It should be understood that by providing a greater or lesser number of devices in each bank or by using devices that are wider than eight bits, other size words of data can be stored at each memory location. The bank address bus 81 is divided into a separate eight bit wide lower bus 81L' and 81L" for the first and second flash memory banks 71 and 72, respectively. These lower buses 81L' and 81L" carry the eight least significant address bits. The remaining more significant address bits are carried by a common upper address bus 81H connected to both memory banks 71 and 72.

A block of addresses are assigned to the flash memory 55 with the storage locations in the first memory bank 71 being assigned odd numbered word addresses and the second memory bank 72 being assigned even numbered word addresses, when operating in the interleaved bank access mode. Thus, bit A2 of an address on bus 64 (the least significant bit of the word address) indicates which memory bank has the desired storage location. From an internal standpoint, both memory banks each contain a storage location at the same the address and memory control 88 determines which of the two flash memory banks 71 or 72 to access based on the least significant word address bit, as will be described.

Figure 4A:
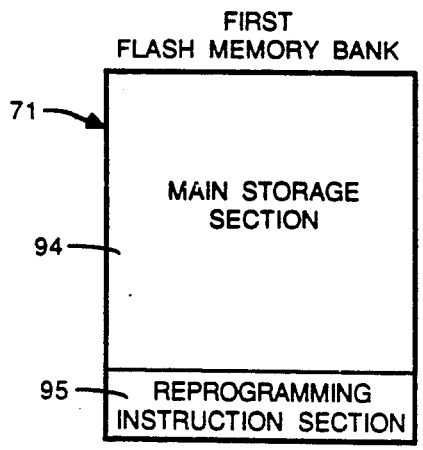
FIGS. 4A and 4B depict a memory map of the storage locations in each bank of the flash memory.
Figure 4B:
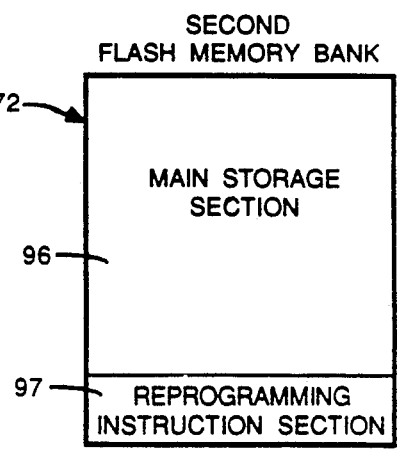

As illustrated in FIGS. 4A and 4B, both the first and second memory banks 71 and 72 are divided into two sections of storage locations 94 and 95, and 96 and 97, respectively. One of these storage sections 95 and 97 in each flash memory bank contains a duplicate copy of program instructions for erasing and programming the flash memory 55. The routines for performing these functions will be described in detail subsequently. The other sections 94 and 96 are used to store other programs and for execution by the second microprocessor 54.

The processor section address bus 64 is connected to a parallel multiplexer 84 which responds to signals on control bus 62 by coupling the processor section address bus 64 to the bank address generator 86 via either the memory address bus 87 or the shifted memory address bus 85. When the multiplexer couples the incoming bus 64 to memory address bus 87, the two least significant bits A∅ and A1 are dropped, in essence dividing the address by four, to generate the word address. This coupling is used in the sequential access mode. In the interleaved bank access mode, the multiplexer drops bits A∅ and A1 and shifts the remaining bits one position to divide the address from the second microprocessor 54 by eight. This drops bit A2 as well from the address applied to the shifted memory address bus 85. Both buses 85 and 87 from multiplexer 84 are applied as an input to a bank address generator 86 which uses the resultant address as the starting address with which to address a series of contiguous storage locations within the first and/or second memory banks 71 and 72 during burst mode addressing. The address generator 86 applies the addresses to the bank address bus 81 upon being enabled by a flash memory control circuit 88.

The address line A2 from the processor section address bus 64 is applied to the flash memory control 88 which uses that address bit to select one of the two flash memory banks 71 or 72 for access in the interleaved mode. Selected lines of the processor section control bus 62 also are connected to the flash memory control 88 to produce signals for controlling the bank address generator 86 and the first and second flash memory banks 71 and 72. The flash memory control 88 also selectively enables one of two sets of bi-directional data buffers 90 and 91 which respectively couple the bank data buses 82 and 83 to the processor section data bus 63. The bank data buses 82 and 83 can be coupled to the instruction bus 61 by the flash memory control 88 selectively enabling buffers 92 and 93, respectively.

The lines of the processor section data bus 63 are connected to the input of the control register 89 which, upon being enabled by a signal on the control bus 62, stores the data carried by those lines. As will be described, one data bit stored in the control register 89 determines whether the flash memory 55 operates in the interleaved bank access mode or in a single bank access mode and in latter mode which bank is to be accessed. In the first of these access modes, storage locations in the first bank 71 are assigned even numbered addresses while the second bank 72 is assigned the odd numbered addresses. In the single bank access mode one and only one of the memory banks 71 or 72 is being accessed. In either accessing mode, the second microprocessor 54 can operate in the burst or sequential addressing modes. Other control register bits individually select the memory banks 71 and 72 for erasure and programming. The outputs of the control register 89 are coupled to the bank multiplexer 84 and the flash memory control 88.

MEMORY ACCESS

The flash memory 55 can be configured to sequentially access only the storage locations in one of the memory banks 71 or 72, or to access both memory banks in an interleaved manner. In the interleaved access mode both banks 71 and 72 are simultaneously activated by address and control signals from the second microprocessor 54, but only one bank at a time is connected by buffers 90-93 to the instruction and data buses 61 and 63. To obtain program instructions from the flash memory in the interleaved access mode, the instructions are alternately read from the two banks 71 and 72.

When program instructions are being read and executed from the main storage sections 94 and 96 in memory banks 71 and 72, a bit in control register 89 places the flash memory 55 in the bank interleaved access mode. The data is stored in the control register 89 by the second microprocessor. In this mode, instructions are read alternately from each flash memory bank, since the even numbered addresses are assigned to the first bank 71 and the odd addresses are assigned to the second bank 72. Furthermore, burst addressing commonly is used by the second microprocessor 54 to obtain instructions for execution from the flash memory. The use of burst mode addressing is indicated by a signal on control bus 62.

The memory access process commences with the second microprocessor 54 generating an address at which the initial instruction of a series of instructions is located. This address, which is even or odd, is conveyed via the address bus 64 of the processor section 31 to the flash memory 55. At the same time, the address decoder circuit 57 decodes the address to produce a series of control signals for properly enabling the read operation of the flash memory 55.

The flash memory control 88 receives conventional control signals sent by the address decoder 57 and the second microprocessor 54 over the control bus 62. These control signals indicate that a read operation is occurring and synchronize the flash memory control 88 to other components of the system controller 16. The flash memory control 88 responds to bit A2 on address bus 64 by enabling the appropriate flash memory bank 71 or 72. Specifically, the flash memory control enables access to the first bank 71 when bit A2 has a low logic level, whereas a high logic level bit A2 enables access to the second bank 72.

The address from the second microprocessor 54 is received by the flash memory bank multiplexer 84 and sent in the interleaved access mode to the bank address generator 86 via the shifted memory address bus 85. The multiplexer shifts the word address one bit to the right, thereby dropping the least significant bit (A2) of the word address. The result of that operation is passed on to the bank address generator 86 where it is used as the first address for accessing the flash memory banks 71 and 72. The most significant bits of this initial address are applied by the bank address generator directly to the upper bank address bus 81H and the eight least significant bits are applied to both of the lower address buses 81L' and 81L".

Assume that the first instruction to be read is stored in the first memory bank 71. The flash memory control 88 enables the memory devices 73-76 and instruction bus buffer 92 so that the first flash memory bank 71 is connected to the instruction bus 61 in the processor section 31. The first memory bank 71 also receives other control signals from the flash memory control 88. The memory devices respond by applying the contents of the addressed location to the first bank data bus 82. A conventional data transfer acknowledge signal is applied by the flash memory control circuit 88 to the control bus 62 when the instruction is available on bus 61. After the access is completed, the flash memory control 88 responds to signals on the control bus 62 by disabling instruction buffer 92.

While the first memory bank 71 is being accessed, the flash memory control 88 is applying control signals to the second memory bank 72 to access its storage location at the same address carried by the bank address bus 81. This causes the contents of that storage location to be applied to the second bank data bus 83. However, since bus buffers 91 and 93 associated with the second memory bank 72 are not enabled at this time, the second bank data bus 83 is not coupled to the processor section buses 61 and 63.

The consecutive program instructions are read alternately from the two memory banks 71 and 72. In the present example, the second program instruction will be read from the second bank 72 of the flash memory 55. When the second microprocessor 54 generates another read request on the control bus 62, the flash memory control 88 will respond by enabling the instruction bus buffer 93 associated with the second memory bank 72. As the first and second instructions were located at the same internal address in each of the two memory banks that instruction already will be present on the second bank data bus 83 from the previous access request. Thus the length of time required to obtain the second instruction is considerably less than that needed for the first instruction.

While the second instruction is being read from the second flash memory bank 72, the bank address generator increments the eight least significant bits for the lower address bus 81L' for the first bank 71. Thus during this cycle, the first bank is accessing the third instruction in the series to be ready when the next access request is received. Because bus buffers 90 and 92 are disabled, the third instruction is not applied to either the data bus 63 or instruction bus 61.

The flash memory control 88 responds to the third request for a program instruction by enabling the first memory bank 71 and the associated instruction bus buffer 92 to read the third instruction from that bank. While this is occurring, the bank address generator 86 increments the least significant address bits that are applied to the lower bus 81L" for the second flash memory bank 72. This action prepares the second bank 72 to supply the next instruction when a subsequent access request is received by the flash memory 55.

In this manner, the flash memory control 88 upon receiving a read request, alternately obtains instructions from the two memory banks 71 and 72. The process speeds the access to a series of contiguous storage locations. As long as each subsequent instruction is located at the next logical address, the bank address generator 86 controls the addressing and the second microprocessor 54 does not have to send an address with each access request.

When the next instruction is not stored in a contiguous memory location, as occurs when a jump instruction is executed, the second microprocessor 54 sends the address of that instruction to the flash memory 55 along with the access request. The flash memory control 88 responds by loading the new address into the bank address generator 86.

Although sequential addressing of the flash memory is not as efficient as burst addressing, sequential addressing can be used to access the storage locations in the interleaved access mode. In this case, the flash memory control 88 receives a signal from the second microprocessor 54 which indicates that the sequential addressing mode will be used. The control 88 responds by directing the bank address generator to apply the address from the shifted memory address bus 85 directly to the bank address bus 81.

When data, instead of program instructions are being read from the flash memory 55, the data can be stored in any one of the memory devices 73-80. As a result both flash memory banks 71 and 72 are activated simultaneously in response to each data request, but only one bank is coupled to the processor section data bus 63. In this situation the multiplexer 84 receives a signal on control bus line 98 which indicates that data, not an instruction, is being sought. This signal causes multiplexer 84 to operate on the incoming address and apply the result to the shifted address bus 85 regardless of whether the interleaved bank or single bank access mode has been designated in the control register. Flash memory control 88 also receives the control signal on line 98 and uses that signal along with the address bit A2 to enable the data buffer 90 or 91 associated with the memory bank 71 or 72 containing the desired data. Although both flash memory banks 71 and 72 receive the address on bus 81 only one of the banks is connected to the processor section data bus 63.

FLASH MEMORY REPROGRAMMING

With continuing reference to FIG. 3, both flash memory banks 71 and 72 must be erased entirely when a program stored in the flash memory 55 is to be updated. However, the software routines for erasing and reprogramming the flash memory also are contained in those storage components. The present flash memory 55 holds duplicate copies of these routines in sections 95 and 97 of the first and second flash memory banks 71 and 72. One bank is reprogrammed at a time while the second microprocessor 54 executes the erasing and reprogramming routines stored in the other bank. After one bank has been erased, the erasing and reprogramming routines are copied into it from the other bank and a program from another source, such as RAM 56, is copied into its main storage section. Then the other bank is reprogrammed using the routines stored in the one bank. As a result, conventional flash memory devices which require that all locations be erased before reprogramming can be utilized to store the instructions to reprogram themselves. Duplicate copies of other critical data, such as system controller initialization or boot-up routines, also can be stored in this manner.

The flash memory reprogramming process will be described in respect of programming the first memory bank 71 with the understanding that similar operations are performed subsequently to program the second memory bank 72. The process commences by the second microprocessor 54 loading the control register 89 in FIG. 3 with configuration data. The control register 89 is loaded with a mode control bit that has a logic level which places the flash memory into the single bank access mode. Another control register bit designates that the first memory bank 71 has been selected for programming. The flash memory control 88 responds to the control bits in register 89 by enabling the appropriate bank for programming. The second microprocessor 54 may use either burst addressing or sequential addressing during the programming operation. The multiplexer 84 responds to signals on the control bus 62 by coupling the processor section address bus 64 to the bank address generator 86 via memory bus 85 or 87 depending upon whether burst or sequential addressing is in use.

Assume that sequential addressing is being employed during the programming operation. Thus an instruction address from the second microprocessor 54 will be applied directly to the bank address generator 86. The flash memory control 88 ignores bit A2 of the word address and always enables only the selected bank. Other signals received by the flash memory control 88 over control bus 62 indicate whether a read or a write operation is requested by the second microprocessor, to which the control circuit 88 responds by sending control signals to the appropriate memory bank 71 or 72.

The flash memory control 88 enables data buffers 90 so that the first memory bank data bus 82 is connected to the processor section data bus 63 during each write or verify access cycle. Buffers 93 similarly are enabled to connect the second memory bank data bus 83 to the processor section instruction bus 61. This set of connections configures the flash memory 55 for the second microprocessor 54 to read instructions for the erasure and reprogramming process from the second flash memory bank 72 and to program the first memory bank 71.

The specific erasure/programming sequence and commands for the flash memory 55 are defined by the manufacturer of the memory devices. A typical process involves first setting each storage location to a low logic level (zero) and then issuing an erase command to the designated memory devices which causes all storage locations to be erased simultaneously. Although ideally every storage location will be erased in response to a single erasure command, it is more common that some of the storage locations will not be erased. Therefore, the second microprocessor 54 must verify the erasure of every storage location in the memory devices and if necessary issue additional erase commands until the entire device is erased.

For a flash memory 55 shown in FIG. 3 where several memory devices 73–76 and 77–80 are connected in parallel to form the first and second banks 71 and 72, it is desirable to save time by erasing a whole bank in unison. However, during the verification process when a storage location in only one of the devices is found not to be erased, it is not desirable to issue a second erase command to all four devices, as flash memory devices can be subjected to only a finite number of erasure cycles before wearing out. Therefore, one of the key features of the present technique is to perform a parallel erasure and verification of the entire bank, but issue additional erase commands only to those memory devices which require further erasure.

Once the entire flash memory bank has been verified as being erased, it can be reprogrammed by storing new program data in the storage locations. As with the erasure technique, the entire bank is reprogrammed in unison. If upon verification a memory device 73–80 failed to retain the data, only that device will be programmed again. Thus the number of programming cycles to which each storage location is subjected also is minimized. The present reprogramming technique performs many operations simultaneously on all the memory devices in a given bank but protects the devices from unnecessary erasing and programming cycles.

A specific flash memory erasure routine according to the present invention is depicted by the flowchart in FIG. 5. Duplicate copies of the instructions for the routine are stored in sections 95 and 97 of both memory banks 71 and 72. The instructions of the program for erasing and reprogramming are read from the other bank. The erasure process commences at step 100 with the second microprocessor 54 setting up control registers 89 to select the particular memory bank 71 and 72 which is to be erased and configure the flash memory circuitry. The routine is the same regardless of which bank is selected and will be explained as though the first bank 71 has been chosen. Next, the programming routine depicted in FIG. 6 is called from step 101 to set each of the memory locations in the first memory bank 71 to zero. This zeroing process will be described subsequently in the course of explaining the operation of the flash memory programming routine.

After all of the storage locations in the first bank 71 have been set to zero, the program execution returns to step 102. At this point, the variables, counters and other registers used in the course of the erasure process are initialized by the second microprocessor 54. The second microprocessor 54 writes an erase set-up command followed by an erase command to the flash memory 55 at step 104. These commands are transmitted via the data bus 63 and data buffer 90 to devices 73–76 in the first memory bank 71. The program then delays at step 106 for a period of time, e.g. ten milliseconds, which is specified by the memory device manufacturer as being necessary after the issuance of the erasure command before erase verification may commence.

The thirty-two bit instructions sent by this routine to the flash memory 71 are divided into four bytes with each byte containing an individual command for one of the memory devices 73, 74, 75 or 76. This enables each device of the bank 71 to be placed in a separate state of operation so that only certain ones of those devices can be erased while others remain in the read state. This is key to the operation of the present invention in that it allows subsequent erasures of only those devices which have not been completely erased by the previous operation. However at this time, all four memory devices 73–76 in the first bank 71 receive identical commands for their erasure.

Ideally, the issuance of a single flash memory instruction at step 104 should cause all of the memory locations within the selected memory bank to be erased. However, this rarely occurs in practice where one or more device in the bank often fails to completely erase. Therefore, beginning at step 108, the second microprocessor 54 sequentially accesses every storage location in the first memory bank 71 to determine whether in fact it has been erased. At this point, the second microprocessor issues a flash memory instruction over the data bus 63 which places each of the memory devices 73–76 of the first memory bank 71 into the erase verify state at which the contents of the devices can be sequentially read in parallel. The program execution then delays at step 110 for a second interval of time, e.g. six microseconds, as specified by the device manufacturer.

Upon advancing to step 112, the second microprocessor 54 obtains a thirty-two bit wide word of data from the first memory bank 71 by sending a storage location address to the flash memory 55. This word of data is then verified to determine that all of its bits have been erased. Assuming for the moment that all of the bits of this data word are erased at step 114, a determination is made by the second microprocessor 54 at step 116 whether the last address in the first flash memory bank 71 has been verified. If that is the case, the erasure routine terminates by returning to the main control program. If additional memory locations remain to be verified, the address for the first flash memory bank 71 stored in a register of the second microprocessor is incremented at step 118. Thereafter, at step 120, an instruction for the flash memory 55 is formed by setting each byte to an erase verify command. The program execution returns to step 108 where the flash memory instruction is sent to insure that each memory device 73–76 is in the erase verify state so that the next location can be checked.

When one or more bits in the word read from the flash memory bank 71 is found not to have been erased at step 114, the program execution branches to step 122. This branch of the program examines each byte of the word to determine which memory devices 73-76 require additional erasure. To do so, a byte pointer is initialized to zero. Then, at step 124, the byte designated by the pointer is examined by the second microprocessor 54 to determine whether all of its bits have been erased. If that is the case, the byte of the flash memory instruction for the memory device from which the inspected data byte was read, is set to the read mode command at step 126 before advancing to step 136.

However, if the examined byte is not erased, the program execution branches to step 128 where the byte of the flash memory instruction for the memory device 73-76 from which the data byte was read, is set to the erase command. Then, at step 130, a counter of the number of erase cycles for that particular memory device 73-76 is incremented and thereafter inspected at step 132. A memory device has exceeded its useful life when 1,000 erasure cycles are performed by this routine and locations of a given memory device still have not erased. When this occurs, the program terminates via step 134 after a signal is sent to the user indicating which device is defective. Then the system goes into a halt state until the memory is replaced.

Assuming that the device has not reached 1,000 erase cycles at step 132, the program execution branches to step 136 where the byte pointer is tested to determine whether all the bytes of the data word have been examined. If additional bytes remain to be examined, the byte pointer is incremented at step 138 before returning to step 124 where the next byte is tested to determine if all of its bits have been erased.

When all the bytes of a given word read from the first flash memory bank 71 have been inspected, the second microprocessor 54 returns to step 104. At this point, each byte of the flash memory instruction stored temporarily in a register of the second microprocessor 54 contains a command to erase the associated memory device 73-76 again, or to place that memory device in the read state because all the locations checked thus far have been erased. At step 104, the flash memory instruction is written to the flash memory 55 causing erasure of the selected memory devices 73-76 which require additional erasure. Next, the same set of memory locations in each of the devices is inspected again to determine if the additional erasure cycle has satisfactorily erased all of the bits stored in those locations.

The second microprocessor 54 continues looping through the steps of the erase routine, inspecting each of the storage locations in the four memory devices 73-76 of the first flash memory bank 71 until all of the storage locations are verified as erased. At that point, the execution of the flash memory erasure routine terminates returning to the main operating program being executed by the second microprocessor 54.

Typically, once one bank of the flash memory 55 has been erased, it will be reprogrammed immediately. This is accomplished by the second microprocessor 54 executing the flash memory programming routine depicted by the flowchart of FIG. 6. The programming process also is utilized at step 101 of the erasure routine to set each of the storage locations in the selected flash memory bank 71 or 72 to zero prior to the application of the erase pulses. Programming all memory cells to zero before erasing can commence is a requirement of the manufacturer of the flash memory devices.

The flash memory programming routine commences at step 140 where the variables, counters and registers utilized by the program are initialized. Then at step 142, a determination is made as to whether the erase mode is active. If the programming routine is not being utilized as part of the erasure process, the program branches to step 143 where the second microprocessor 54 sends data to the control register 89 to configure the flash memory circuit 55 for the program mode and designate one of the two memory banks 71 or 72 is to be reprogrammed. Assume once again that the first bank is selected.

Then a thirty-two bit flash memory instruction is formed at step 144. This instruction is similar to those used by erasure routine in that each byte contains a separate command for one of the memory devices 73-76 in the first bank 71 being reprogrammed. Each byte is configured individually so that one or more devices can be placed in the read mode while other devices are being programmed. This feature is utilized in the case where a storage location in one memory device does not retain the data from the first programming cycle and requires an additional cycle. Therefore, only those memory devices 73-76 which were not reprogrammed successfully in the first cycle will receive the second reprogramming command. However, initially all the bytes of the flash memory instruction are loaded with the set-up program command. A set of four counters also is set to count the number of programming cycles required to reprogram a location in each of the four memory devices.

The program execution then advances to step 146 where a determination is made whether the process being performed is an erasure or a programming operation. If the flash memory is in the programming mode, the software fetches a program instruction word from the RAM 56 at step 148, the second flash memory bank 72 or other device in the system that contains the program to be loaded into the first flash memory bank 71. The location of the instruction is indicated by a source address held in a register of the second microprocessor 54. The fetched word is stored temporarily within a data register of the second microprocessor 54 at step 148. If the programming routine is being executed at the outset of the erasure routine, the execution branches to step 150 where this data register of the second microprocessor is set to zeroes. As indicated previously, the programming routine in FIG. 6 also is utilized at the outset of the erasure routine to reset all of the storage locations of the flash memory bank to zero.

Once the instruction to be stored has been obtained at either step 148 or 150, a set of four set-up and program commands is sent to the flash memory 55 at step 152 which place each memory device in a state to receive data for storage. The flash memory control 88 in FIG. 3 has previously enabled the first bidirectional data buffer 90 to couple the processor section data bus 63 to the data bus branch 82 for the first flash memory bank 71. The commands of the flash memory instruction are carried in parallel along this path to the memory devices 73-76. Each memory device responds to a separate byte of the flash memory instruction that contains the particular command for that device. At the initial phase of reprogramming a given location, each of these bytes will contain the program set-up command. Following the issuance of the flash memory instruction, the second microprocessor 54 transmits the address of a storage location via the address bus 64 and applies to data bus 63 the program instruction for storage.

Referring to FIG. 3, the data stored in the control register 89 for the programming places the multiplexer 84 in a state in which the processor section address bus 64 is connected directly to the bank address generator 86 via memory address bus 87. The flash memory control 88 also responds to the control signals by issuing the appropriate commands to the first flash memory bank 71 which has been selected for reprogramming. The memory devices 73-76 in the first flash memory bank 71 responds to the program setup command by storing the bits on bus 82 into the addressed storage location. A delay of ten microseconds is required at step 153 before a program verify command can be issued by the microprocessor 54.

Once this occurs, the second microprocessor 54 issues a set of program verify commands via data buses 63 and 82 and the bidirectional buffer 90 at step 154. These commands place the memory devices 73-76 into write states in which the program instruction which has just been stored at the currently accessed storage locations are read from the devices and applied to the processor section data bus 63. In the meantime, the second microprocessor 54 delays at step 156 for six microseconds to allow the flash memory bank 71 to comply with the verification commands. At the end of this delay interval, the second microprocessor 54 reads the data at step 158 and at step 160 compares the data read from the first flash memory bank 71 to that used at step 152 to program the storage location.

Assuming for the moment that the comparison indicates that these words are identical as occurs when the flash memory has been properly programmed, the program execution branches to step 162 where a determination is made as to whether the program instruction has been stored in the first memory bank 71. If additional instructions remain to be stored, the pair of address registers indicating the storage location in the first flash memory bank 71 and the storage location of the source of the programming data are both incremented at step 164. As the instructions are being written to only one bank 71 or 72 of the flash memory 55 at a time, the destination address for the instruction is incremented by eight bytes, thereby bypassing storage locations in the other memory bank. The program execution then returns to step 144 to program the next storage location in the flash memory 55. However, when the last location of the first flash memory bank 71 has been programmed, the software routine returns to the program that called it.

When the second microprocessor 54 determines at step 160 that the currently accessed storage locations in the flash memory 55 were not properly programmed, the execution of the flash memory programming routine branches to step 170 of FIG. 6. In this program branch, each byte of the word read from the storage locations is inspected to determine which of the parallel memory devices 73-76 failed to be programmed. At the outset of this portion of the routine, a byte pointer is initialized. The corresponding bytes designated by this pointer are obtained from the word read from the flash memory 55 and from the instruction word that was just stored at step 152.

The second microprocessor 54 then compares these bytes at step 174 to determine whether they are equal, which indicates that the corresponding memory device was properly programmed. If such is the case, the program execution branches to step 175 where the byte of the flash memory instruction for the memory device 73-76 that contains the compared data is loaded with a read mode command. In this case, the corresponding memory device 73-76 has been properly programmed and must be sent to the read mode so that it will not be needlessly subjected to another reprogramming cycle when one or more of the other parallel memory devices is reprogrammed. The flash memory instruction is stored temporarily in a register of the second microprocessor 54.

If the bytes compared at step 174 are found to be unequal, indicating that a satisfactory programming of the associated memory device 73, 74, 75 or 76 did not occur, step 176 is executed. At this step, the associated memory device which failed to be programmed is designated for reprogramming by loading the set-up program command in the byte of the flash memory instruction for that memory device. A programming counter for the memory device is incremented at step 178 and checked at step 180 to determine whether twenty-five attempts have been made to program this particular storage location without success. If such is the case, a signal is sent to the user at step 182 indicating that this memory device is defective and the program execution then halts.

Assuming that twenty-five attempts at reprogramming this storage location have not occurred, the second microprocessor 54 checks the byte pointer at step 184 to determine whether all bytes of the data word have been checked. If additional ones remain to be checked, the byte pointer is incremented at step 186 before returning to step 172 to check another byte.

Once the four bytes from the memory devices 73-76 have been checked for programming success, the program execution returns from step 184 to step 152. The previous instruction data is applied to the memory bank 71 again in an attempt to program those memory devices which were not successfully programmed in the previous cycle. However, only the memory devices that failed to store the instructions on previous attempts are placed into the program mode, the others are in the read mode.

The second microprocessor 54 continues to loop through the steps of the flash memory programming routine depicted in FIG. 6 until either one of the devices is found to be defective at step 180 or the last instruction has been found to be satisfactorily stored at step 162.

The present erasure and reprogramming techniques offer several advantages over those previously utilized for flash memories. The process described herein performs many of the erasing and reprogramming operations in parallel, thereby carrying out the process as fast as the memory devices will permit. However, when an unsuccessful erasure or programming is detected, only the affected devices are erased or programmed again until satisfactory operation of those devices is detected. This spares the devices which have functioned satisfactorily from being subjected to unnecessary additional erasing and programming cycles. Thus, the present technique does not prematurely wear out devices which have been performing satisfactorily.

The invention being claimed is:

1. A memory circuit for storing words of digital data comprising:
   a first means for receiving a storage location address;
   a second means for receiving control signals requesting access to the memory circuit;
   a means for exchanging data with an external device;
   first and second memory banks each having a series of storage locations and being coupled to said means for exchanging data;

an address bus connected to said first and second memory banks;

means for controlling said first and second memory banks, having a first mode in which this latter means responds to an address and a request for access received respectively from said first and second means for receiving by reading data from a storage location in one of said memory banks, and thereafter generating addresses on said address bus to read data alternately from storage locations in said first and second memory banks in response to subsequent requests for access to the memory circuit, and having a second mode in which said means for controlling responds to an address and a request for access to the memory circuit by enabling only one of said first and second memory banks and thereafter generating addresses on said address bus to read information sequentially from storage locations in the one bank.

2. The memory circuit as recited in claim 1 wherein each one of said first and second memory banks is formed by a plurality of integrated circuit memory devices connected in parallel with each device storing a different group of bits of a word of digital data.

3. The memory circuit as recited in claim 1 wherein:
said means for exchanging data comprises first and second data buffers connected respectively to said first and second memory banks with each data buffer being enabled by a separate control signal from said means for controlling; and
said means for controlling in the first mode responds to a request for access by simultaneously enabling both memory banks for the reading of data stored therein, but enables only one of said first and second data buffers.

4. A memory circuit for storing multiple bit words of digital data comprising:
a first means for receiving control signals requesting access to the memory circuit;
first and second memory banks each having a series of storage locations;
an address but connected to said first and second memory banks;
a second means for receiving a storage location address consisting of a plurality of binary bits and providing a first address value and a second address value that is substantially equal to one-half the first address value;
an address generator coupled to said second means for receiving, and producing a sequence of output addresses in response to the second address value which indicates an initial output address of the sequence and applying the output addresses to said address bus when enabled by a control signal received by said memory circuit, otherwise said address generator applies the first address value to said address bus; and
a means for controlling said address generator and said first and second memory banks, and in a first mode said means for controlling is responsive to each request in a series of requests for access to the memory circuit by reading stored data alternately from the first and second memory banks, and having a second mode in which said means for controlling responds each request in a series of requests for access to the memory circuit by enabling a same one of said first and second memory banks.

5. The memory circuit as recited in claim 4 wherein each of said first and second memory banks is formed by a plurality of integrated circuit memory devices connected in parallel with each device storing a different group of bits of a word of digital data.

6. The memory circuit as recited in claim 5 wherein said second means for receiving divides the storage location address by an amount of the integrated circuit memory devices in each memory bank to provide the first address value and divides the storage location address by twice the number of the devices in each memory bank to provide the second address value.

7. The memory circuit as recited in claim 4 further comprising:
an input/output data bus; and
first and second data buffers respectively coupling the first and second memory banks to said input/output data bus when each data buffer is enabled by a separate control signal from said means for controlling.

8. The memory circuit as recited in claim 7 wherein said means for controlling in the first mode responds to a request for access by simultaneously enabling both said first and second memory banks for the reading of data stored therein, but enables only one of said first and second data buffers.

9. A method of erasing a memory circuit that includes a first bank of a plurality of memory devices coupled in parallel to form a set of storage locations, each memory device being responsive to an erase command by erasing a plurality of data storage areas in the device; steps of said method comprising:
(a) issuing the erase command to every memory device in the first bank;
(b) then sequentially reading the contents of each storage location and determining whether every bit of the storage location has been erased; and
(c) when a given storage location is found to contain a bit that was not erased, sending another erase command to only those memory devices associated with the bit that was not erased, and then reading the contents of the given storage location to determine whether every bit now has been erased.

10. The method as recited in claim 9 in which the step of sequentially reading the contents of each storage location simultaneously reads data from every memory device of the bank.

11. The method as recited in claim 9 the steps of which further comprises after determining that all of the storage locations have been erased:
(d) simultaneously placing all the memory devices into a write state for the storage of data;
(e) sending an address of a specific storage location and a word of data to the memory devices;
(f) reading the contents of the given storage location;
(g) comparing the contents read from the specific storage location to the word of data sent to determine whether the word of data has been stored properly; and
(h) when the comparing step indicates that the word of data has not been stored properly, placing into the write state only those memory devices which did not properly store bits of the data word, and sending the word of data again to the memory circuit.

12. The method as recited in claim 11 in which the step of reading the contents of the specific storage location simultaneously reads data from every memory device.

13. The method as recited in claim 11 further comprising following step (h) returning to step (f) to verify whether the data now has been stored properly.

14. The method as recited in claim 11 further comprising after step (g) determines that the word of data has been stored properly returning to step (d) to store another word of data in a different storage location.

15. The method as recited in claim 11 in which the memory circuit further includes a second bank of a plurality of memory devices coupled in parallel to form a set of storage locations, each memory device being responsive to an erase command by erasing a plurality of data storage areas in the device; and wherein separate copies of a program which controls the erasing and storing of data in the memory circuit is stored in each bank and while erasing or storing operations are being performed on one bank the program is being read from the other bank.

16. A method of reprogramming a memory circuit that includes a bank of a plurality of memory devices coupled in parallel to form a set of storage locations, steps of said method comprising:

(a) simultaneously placing all the memory devices in a write state for the storage of data;
(b) sending an address of a given storage location and a word of data to the memory devices;
(c) reading the contents of the given storage location;
(d) comparing the contents read from the given storage location to the word of data sent to determine whether the word of data has been stored properly; and
(e) when the comparing step indicates that the word of data has not been stored properly, placing in the write state only those memory devices which did not properly store portions of the data word and sending the word of data again to the memory circuit.

17. The method as recited in claim 16 further comprising following step (e) returning to step (c) to verify whether the data now has been stored properly.

18. The method as recited in claim 16 further comprising after step (d) determines that the word of data has been stored properly returning to step (a) to store another word of data in a different storage location.

19. The method as recited in claim 16 in which the step of reading the contents of the given storage location simultaneously reads data from every memory device.

* * * * *